(12) United States Patent
Muessener et al.

(10) Patent No.: US 10,361,730 B2
(45) Date of Patent: Jul. 23, 2019

(54) AMPLIFIER DEVICE FOR HIGH FREQUENCY SIGNALS

(71) Applicant: Rohde & Schwarz GmbH & Co. KG, Munich (DE)

(72) Inventors: Karl-Martin Muessener, Berlin (DE); Florian Ohnimus, Berlin (DE); Lothar Schenk, Berlin (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 35 days.

(21) Appl. No.: 15/456,026

(22) Filed: Mar. 10, 2017

(65) Prior Publication Data

US 2017/0302304 A1 Oct. 19, 2017

(30) Foreign Application Priority Data

Apr. 18, 2016 (EP) ..................................... 16165873

(51) Int. Cl.
*H04B 1/04* (2006.01)
*H03F 1/32* (2006.01)
(Continued)

(52) U.S. Cl.
CPC ............. *H04B 1/04* (2013.01); *H03F 1/3247* (2013.01); *H03F 3/19* (2013.01); *H03F 3/245* (2013.01);
(Continued)

(58) Field of Classification Search
CPC ................. H03F 1/3247; H03F 1/3252; H04B 2001/0425; H04B 1/0475; H04B 1/62;
(Continued)

(56) References Cited

U.S. PATENT DOCUMENTS 6,166,601 A 12/2000 Shalom et al.
7,133,466 B2 * 11/2006 Maruyama ............ H03F 1/3241
375/297

(Continued)

FOREIGN PATENT DOCUMENTS

GB 2245115 A 12/1991

OTHER PUBLICATIONS

Extended European Search Report dated Oct. 19, 2016, issued in corresponding European Application No. 16165873.7, filed Apr. 18, 2016, 7 pages.

*Primary Examiner* — David S Huang
(74) *Attorney, Agent, or Firm* — Christensen O'Connor Johnson Kindness PLLC

(57) ABSTRACT

An amplifier device for high frequency signals, in particular a linear high frequency amplifier device, which comprises at least one input, an incoming line, a pre-distortion unit, in particular an adaptive pre-distortion unit, an amplifier unit, in particular a non-linear power amplifier unit, a transmission line, a feedback unit, and an output. The output is connected to the amplifier unit via the transmission line. In addition, the at least one input is connected to the pre-distortion unit such that two incoming branch lines are provided which are interconnected by a switching unit. A first incoming branch line of the incoming branch lines comprises a down-converter being arranged between the at least one input and the pre-distortion unit.

23 Claims, 2 Drawing Sheets

(51) Int. Cl.
*H03F 3/19* (2006.01)
*H03F 3/24* (2006.01)
*H03F 3/60* (2006.01)
*H03F 3/72* (2006.01)

(52) U.S. Cl.
CPC ............... *H03F 3/60* (2013.01); *H03F 3/72* (2013.01); *H03F 2200/111* (2013.01); *H03F 2200/204* (2013.01); *H03F 2200/207* (2013.01); *H03F 2200/249* (2013.01); *H03F 2200/451* (2013.01); *H03F 2203/7209* (2013.01); *H04B 2001/0425* (2013.01)

(58) Field of Classification Search
CPC .... H04B 2001/0433; H04B 2001/0441; H04L 27/368
See application file for complete search history.

(56) References Cited

U.S. PATENT DOCUMENTS

| | | |
|---|---|---|
| 7,904,033 B1 | 3/2011 | Wright et al. |
| 8,331,487 B2 | 12/2012 | Yu et al. |
| 2006/0067426 A1* | 3/2006 | Maltsev ............... H04L 25/49 375/297 |
| 2006/0276146 A1* | 12/2006 | Suzuki ............... H03F 1/3252 455/114.3 |
| 2009/0207776 A1* | 8/2009 | Baik ............... H04B 7/15585 370/315 |
| 2010/0230593 A1* | 9/2010 | Hill, Jr. ............... G01M 3/38 250/330 |
| 2011/0012680 A1 | 1/2011 | Kaido et al. |
| 2013/0082773 A1 | 4/2013 | Yu |

* cited by examiner

AMPLIFIER DEVICE FOR HIGH FREQUENCY SIGNALS

FIELD OF THE DISCLOSURE

Embodiments of the present invention relate generally to amplifier devices for high frequency signals, which comprise, among other things, a pre-distortion unit for correcting the signal to be amplified.

BACKGROUND

Amplifier devices for high frequency signals are known which linearize or correct an incoming signal to be amplified. The signals are corrected or distorted by different techniques wherein several different techniques are mainly used by power amplifiers for high frequency signals.

One of these techniques is the digital pre-distortion technique. The digital pre-distortion technique is typically used when an operator of the power amplifier has access to the baseband signal of a high frequency signal which means that the operator uses a system comprising the amplifier device and a modulator. The digital pre-distortion technique compensates amplitude-modulation-to-amplitude-modulation (AM-AM) as well as amplitude-modulation-to-phase-modulation (AM-PM). Further, memory effects are also compensated by this technique. For instance, an amplifier device using the digital pre-distortion technique is described in U.S. Pat. No. 7,904,033 B1.

SUMMARY

Due to new developments in the field of semiconductors, it is meanwhile possible to distort high frequency signals independently of the modulation signal. The correction or pre-distortion is achieved in a manner similar to the digital pre-distortion since amplitude-modulation-to-amplitude-modulation and amplitude-modulation-to-phase-modulation are compensated while memory effects are also being considered. One aspect of this technique relates to the arrangement of the different units wherein the pre-distortion unit is arranged directly in front of an amplifier unit of the amplifier device. However, the frequency range of the incoming signal that can be processed is limited by such an amplifier device.

Furthermore, the correction or pre-distortion of incoming signals is obtained by analogous pre-distortion circuits for intermediate or low frequencies. However, the frequency range of the incoming signal that can be processed is limited by such an amplifier device.

Embodiments of the present invention provide an amplifier device for high frequency signals, in particular a linear high frequency amplifier device, which comprises at least one input, an incoming line, a pre-distortion unit, in particular an adaptive pre-distortion unit, an amplifier unit, in particular a non-linear power amplifier unit, a transmission line, a feedback unit, and an output. The output is connected to the amplifier unit via the transmission line, wherein the at least one input is connected to the pre-distortion unit such that two incoming branch lines are provided which are interconnected by a switching unit. The first incoming branch line of the incoming branch lines comprises a down-converter being arranged between the at least one input and the pre-distortion unit.

One or more aspects of the present invention are based on the finding that different frequencies can be processed by the amplifier device when the input line has at least one junction so that two incoming branch lines are provided which can be used to process incoming signals having low, intermediate and high frequencies. The switching unit positioned in front of the pre-distortion unit as well as the down-converter arranged in the first incoming branch line ensure that the signal to be processed by the pre-distortion unit has a frequency which can be processed by the pre-distortion unit. Accordingly, a pre-distortion unit can be used which has a limited frequency range, in particular an analog pre-distortion unit. Therefore, the amplifier device can process low, intermediate and high incoming signals such that the incoming signals are corrected, up-converted and amplified which ensures that linearized and amplified high frequency signals are outputted irrespective of the frequency of the incoming signals. In some embodiments, both incoming branch lines are configured to process the incoming signals fed to the at least one input. In these embodiments, the incoming line comprises two branch lines that may be merged or split and merged. However, both incoming branch lines are directed to the at least one input such that the incoming signals may be processed by both incoming branch lines depending on the switching position of the switching unit.

In general, the switching unit and the two branch lines ensure that different frequency ranges can be processed by the amplifier device. Particularly, the at least two frequency ranges provide an unlimited frequency range.

In some embodiments, an up-converter is provided that is arranged between the pre-distortion unit and the amplifier unit. The up-converter converts the pre-corrected intermediate or low frequency signal upwardly to a high frequency signal such that a high frequency signal is amplified afterwards. Further, the up-converter also converts the pre-corrected and previously down-converted high frequency incoming signal upwardly such that the incoming high frequency signal is corrected and amplified even though a pre-distortion unit is used which can only process intermediate or low frequency signals.

According to one aspect, the feedback unit is connected to the pre-distortion unit and the feedback unit is coupled to the transmission line via a coupler, particularly a directional coupler. Therefore, the pre-distortion unit can be implemented as an adaptive one as a feedback signal is generated and this feedback signal is fed back to the pre-distortion unit. The feedback signal corresponds to the amplified signal which is transmitted to the output. Accordingly, a continuous adaption of the pre-distortion or linearization is possible.

In some embodiments, the feedback unit can comprise a down-converter which down-converts the signal received by the coupler. Thus, the amplified high frequency signal that is tapped/picked off by the feedback unit is down-converted such that the pre-distortion unit receives an intermediate or low frequency signal.

In some embodiments, the switching unit comprises at least one switch, in particular a high frequency switch. The switch in various embodiments is a simple implementation of a switching unit for connecting two branch lines and providing a junction, respectively. Alternatively, a switching circuit can be used instead of a simple switch.

According to one embodiment, the amplifier device comprises a high frequency input and a low or intermediate frequency input wherein the high frequency input and the low or intermediate frequency input are connected to the first branch line and the second branch line, respectively. Two different inputs are provided which are used for different incoming signals. The operator of the amplifier device has to choose the input which should be used in order to ensure that the "correct" incoming branch line processes the incoming signals.

According to another embodiment, the amplifier device comprises exactly one input that is connected to the switching unit via the incoming line. This ensures that the operator does not choose the wrong input by mistake. Accordingly, the risk of error is reduced. The incoming signal is fed into the same input irrespective of the frequency of the incoming signals. Thus, a low, intermediate or high frequency signal is fed into the same input as only one input is provided. However, the operator has to control the switching unit manually such that the correct incoming branch line processes the incoming signals. Alternatively, an automatic control of the switching unit can be realized which further reduces the risk of error.

A frequency detection unit can be provided in some embodiments, which comprises at least one frequency detector which detects the frequency of a signal transmitted via the incoming line. The frequency of the incoming signal is detected wherein the information regarding the frequency of the incoming signal is used during further processing the incoming signal. For instance, an automatic setting of the switching unit is provided and/or the information regarding the frequency is provided such that the operator knows how to set the amplifier device manually.

The frequency detection unit in some embodiments can be connected to the switching unit, in particular such that the frequency detection unit controls the switching unit in dependence of the detected frequency. Thus, the switching unit is automatically controlled by the frequency detection unit. The operator of the amplifier device only has to feed a signal to the input in order to receive an amplified high frequency output signal since the amplifier device automatically processes the incoming signal irrespective of the frequency of the incoming signal. In other words, the control and setting of the amplifier device is done completely automatically. The incoming signal may have a low, intermediate or high frequency. The automatic control is achieved by the switching unit and the frequency detection unit, in particular their interaction.

In some embodiments, the frequency detection unit comprises at least one filter arranged in one of the incoming branch lines, in particular two filters arranged in both incoming branch lines, respectively. The at least one filter is used to check if a signal is processed by the dedicated incoming branch line. The at least one filter can be a lowpass, a bandpass or a highpass filter. The exact type of filter depends on the incoming branch line which comprises the filter. The incoming branch line processing the high frequency incoming signals comprises a highpass or a bandpass filter whereas the incoming branch line processing the intermediate or low frequency incoming signals has a bandpass or a lowpass filter.

According to another aspect, the amplifier device is configured such that the incoming frequency range is unlimited. The amplifier device can be fed by signals having all frequencies because of the design of the incoming line, in particular the incoming branch lines and the down-converter arranged in the first incoming branch line. Thus, neither a lower limit nor an upper limit for the frequency of the incoming signal exists which has to be considered by the operator of the amplifier device.

The amplifier device in some embodiments can further be configured such that any proportion of incoming to output signal is useable. As a down-converter and an up-converter are arranged in front of/upstream and behind/downstream the pre-distortion unit, respectively, each proportion of the incoming to output signal can be achieved since the down-converter and the up-converter may have different conversion ratios. The desired proportion depends on the adjustments and settings of the operator, in particular regarding the down- and/or up-converter.

According to an embodiment, the amplifier device comprises an operating switch that is operable by an operator of the amplifier device wherein the operating switch is configured such that the switching unit can be switched by the operator when the operator actuates the operating switch. The operating switch can be a switch having two positions, for instance a first position for processing high frequency incoming signals and a second position for processing low or intermediate frequency incoming signals. The operating switch is connected to the switching unit such that the position of the operating switch determines which of the two incoming branch lines is used for processing the incoming signals. The operating switch can be disposed on the housing such that the operator actuates the operating switch manually.

Further, an operator panel can be provided in some embodiments, in particular a graphical user interface is displayed on a display of the operator panel, wherein the operator can control the switching unit via the operator panel and/or information regarding the incoming frequency is shown on the operator panel. The user can easily set the amplifier device, in particular control the switching unit, via the operator panel. For instance, a display, in particular a touch sensitive display, is provided which displays an interactive graphical user interface having two areas for the low/intermediate frequency range and the high frequency range, respectively. Alternatively or supplementary, the operator panel shows information regarding the settings of the amplifier device and/or the frequency of the incoming signal to be processed and amplified by the amplifier device. The operator of the amplifier device can use the information given in order to control the amplifier device.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

Figure 1:
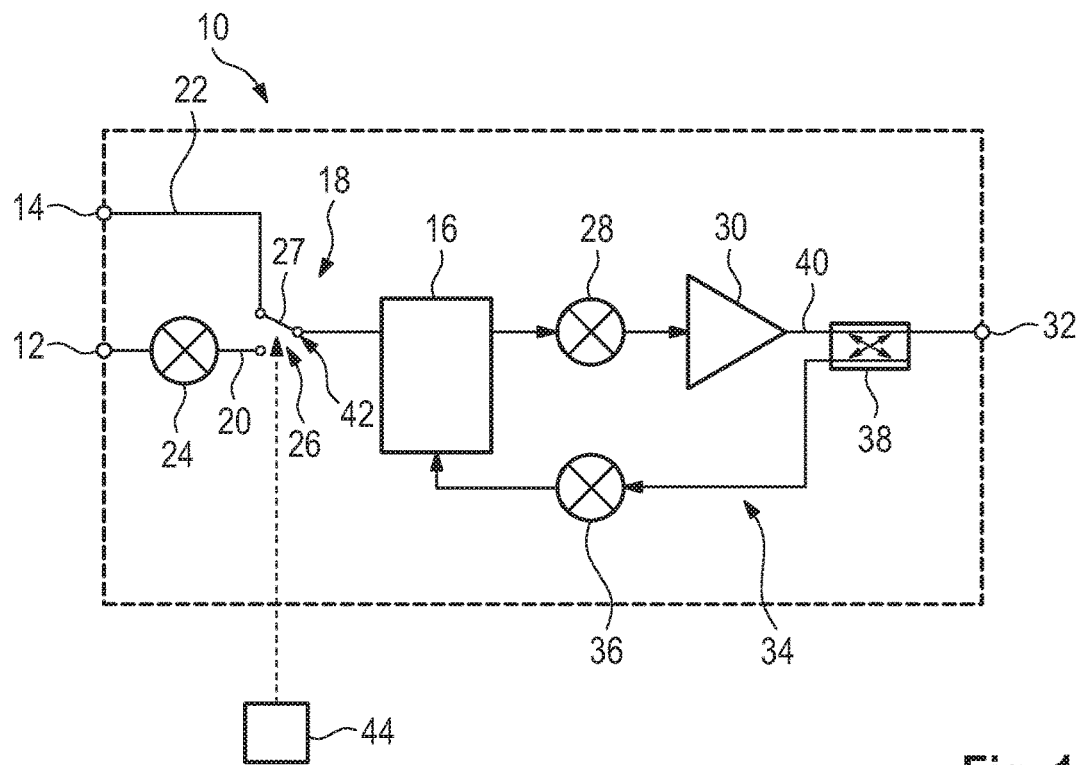
FIG. 1 schematically shows a circuit diagram of an amplifier according to a first embodiment.

In FIG. 1, a circuit diagram of an amplifier device 10 for high frequencies is schematically shown.

In the shown embodiment, the amplifier device 10 comprises a high frequency input 12 and a low or intermediate frequency input 14 which each are connected to a pre-distortion unit 16 via an incoming line 18.

The pre-distortion unit 16 can be a RF power linearizer (RFPAL).

The incoming line 18 is at least partially divided into two incoming branch lines 20, 22 wherein the first incoming branch line 20 is connected with the high frequency input 12 and a down-converter 24 is provided in the first incoming branch line 20 which down-converts the incoming signal of the high frequency input 12 as will be described later.

The second incoming branch line 22 of the incoming line 18 is connected to the intermediate or low input 14.

The first incoming branch line 20 and the second incoming branch line 22 are connected to each other in a junction by a switching unit 26 such that the pre-distortion unit 16 is connected to only one line. In the shown embodiment, the switching unit 26 comprises a switch 27 having two positions, in particular a high frequency switch. Accordingly, both incoming branch lines 20, 22 are merged by the switching unit 26.

In the first position of the switch 27, the first incoming branch line 20 and the high frequency input 12 are connected to the pre-distortion unit 16 whereas the second incoming branch line 22 and the low/intermediate input 14 are connected to the pre-distortion unit 16 in the second position of the switch 27 which is shown in FIG. 1.

In the shown embodiment, the switching unit 26 is formed by the switch 27 which forms the junction and which is arranged between the two incoming branch lines 20, 22 and the pre-distortion unit 16.

In general, the switching unit 26 is arranged between the input(s) 12, 14 and the pre-distortion unit 16 in order to select the incoming branch line 20, 22 which processes the incoming signal.

The switching unit 26 divides and/or merges the incoming branch lines 20, 22.

Further, the amplifier device 10 comprises an up-converter 28 which is arranged after the pre-distortion unit 16. The up-converter 28 converts the signal of the low or intermediate input 14 and the previously down-converted incoming high frequency signal upwardly after the pre-distortion unit 16 has corrected or linearized the corresponding signal, appropriately.

After the up-conversion of the corrected signal by the pre-distortion unit 16, the signal is amplified by an amplifier unit 30 which is arranged behind the up-converter 28. The amplifier unit 30 can be a non-linear power amplifier.

Then, the pre-distorted and amplified signal is transmitted to an output 32 which can be connected to different devices such that the amplified and corrected high frequency signal can be used by the device which is connected to the output 32.

Accordingly, regardless the fact which frequency the signal has that is fed to the amplifier device 10, it is ensured that the incoming signal is linearized, up-converted to a high frequency and then amplified. Thus, a corrected and amplified high frequency output signal is always obtained by the amplifier device 10 irrespective of the frequency of the incoming signal.

Further, the amplifier device 10 comprises a feedback unit 34 which comprises inter alia a down-converter 36 and a coupler 38, in particular a directional coupler.

The feedback unit 34 is connected to a transmission line 40 being arranged between the amplifier unit 30 and the output 32 as well as to the pre-distortion unit 16. Accordingly, the feedback unit 34 picks off the corrected and amplified high frequency signal which will be outputted. In other words, the corrected and amplified high frequency signal transmitted to the output 32 is coupled into the feedback unit 34 by the coupler 38.

The feedback unit 34, in particular its down-converter 36, converts the high frequency signal downwardly such that the down-converted, corrected and amplified signal is fed to the pre-distortion unit 16. This feedback signal is used by the pre-distortion unit 16 to determine whether the correction/linearization is good or not. Thus, the correction/linearization is adaptive which means that the pre-distortion unit 16 is an adaptive one. Hence, the linearization or correction of the signals is performed inter alia in dependence of the corrected and amplified signal which is received by the feedback unit 34.

Accordingly, the correction/linearization of the signal to be amplified is continuously adapted.

The amplifier device 10 can further comprise an operating switch 42 which is provided at a housing of the amplifier device 10 such that an operator has easy access to the operating switch 42. An operator of the amplifier device 10 can control the switching unit 26 by the operating switch 42 such that the operator determines if the amplifier device 10 should receive a high frequency incoming signal or an intermediate/low frequency incoming signal.

In the shown embodiment, the operating switch 42 is formed by the switch 27 itself. The switch 27 shown in the circuit diagram represents the (electrical) function of the objective operating switch 42 which is manually set by the operator.

Alternatively, the operating switch 42 can be connected to the switching unit 26 in order to control the whole switching unit 26 as will be described later.

Supplementary or alternatively to the operating switch 42, the amplifier device 10 can comprise an operator panel 44 which is also provided at the housing of the amplifier device 10. The operator panel 44 provides information regarding the frequency of the incoming signals and/or the switching unit 26 can be controlled by the operator panel 44.

For instance, the operator can easily control the amplifier device 10, in particular the switching unit 26, via the operator panel 44 by choosing the expected frequency range of the incoming signals. The switching unit 26, in particular the switching position of the switch 27, is then set depending on the input of the operator on the operator panel 44. Therefore, the operator panel 44 is also connected to the switching unit 26.

The operator panel 44 can comprise a display, particularly a touch-sensitive display, which displays a graphical user interface. This enables a direct interaction such that the operator just touches a certain area of the graphical user interface in order to control the amplifier device 10, in particular regarding the frequency range of the incoming signal to be processed by the amplifier device 10.

In general, the amplifier device 10 is configured such that the incoming frequency range is unlimited as high frequency incoming signals are previously down-converted by the down-converter 24 and the down-converted signals are corrected by the pre-distortion unit 16. After the pre-correction, the signals are up-converted by the up-converter 28 and then amplified by the amplifier unit 30.

Furthermore, it is possible that the amplifier device 10 is applicable for any proportion of incoming to output signal because of the two different incoming branch lines 20 and 22, the down-converter 24 being arranged upstream the pre-distortion unit 16 and the up-converter 28 being arranged downstream the pre-distortion unit 16.

Figure 2:
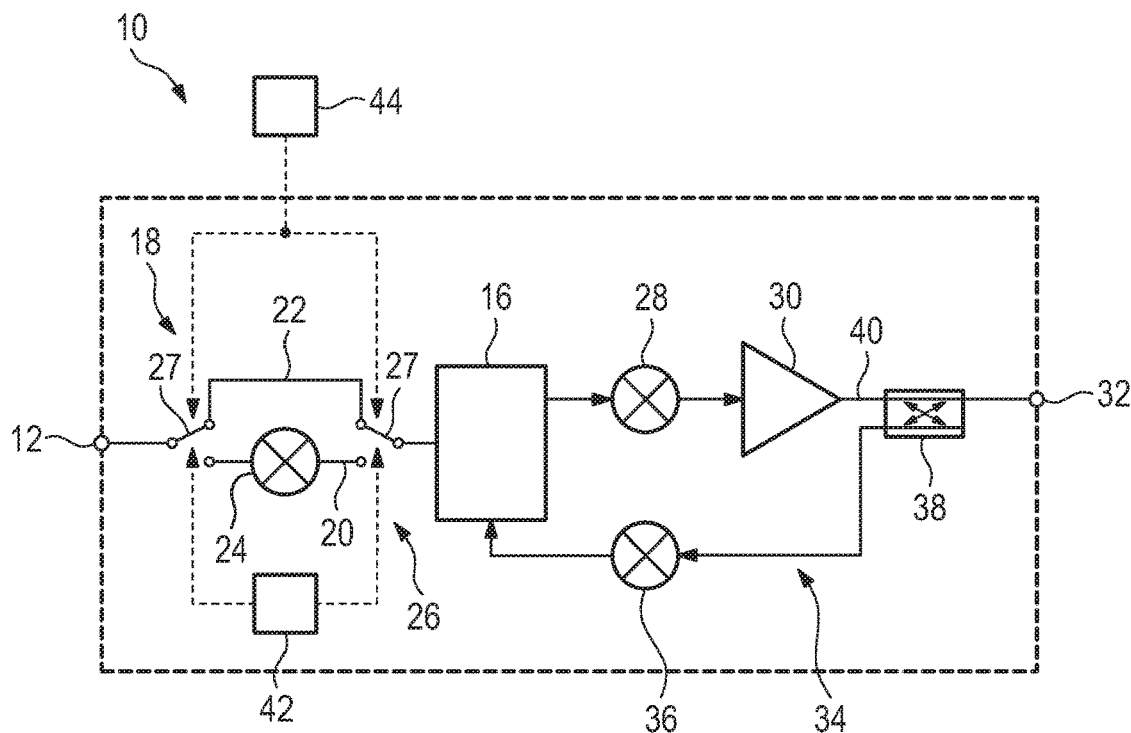
FIG. 2 schematically shows a circuit diagram of an amplifier according to a second embodiment.

In FIG. 2, a second embodiment of the amplifier device 10 is shown which distinguishes from the first embodiment in that exactly one input 12 is provided instead of two different inputs. However, the exactly one input 12 is also connected to the pre-distortion unit 16 by the incoming line 18.

Similar to the first embodiment, the incoming line 18 also comprises two incoming branch lines 20, 22 wherein the first incoming branch line 20 comprises the down-converter 24 for down-converting a high frequency incoming signal fed to the exactly one input 12.

The second embodiment distinguishes further from the first embodiment in that the switching unit 26 comprises two switches 27 instead of one switch wherein the switches 27 are arranged in front of and after both incoming branch lines 20, 22. Thus, the exactly one input 12 is connected to the incoming line 18 which comprises a junction from which the first and the second branch lines 20, 22 continue. Afterwards, a second junction is provided to merge both branch lines 20, 22. Both junctions each comprise one of the switches 27. Accordingly, both incoming branch lines 20, 22 are split from the portion of the incoming line 18 being connected to the input 12 by the first switch 27 of the switching unit 26. Further, both incoming branch lines 20, 22 are merged by the second switch 27 of the switching unit 26 in order to form a single portion of the incoming line 18 being connected to the pre-distortion unit 16.

Therefore, the pre-distortion unit 16 is only fed by one line.

The first incoming branch line 20 is set active and processes the incoming signals when an operator of the amplifier device 10 sets the switching unit 26 accordingly whereas the switches 27 of the switching unit 26 have the position as shown in FIG. 2 when the operator sets the switching unit 26 to an intermediate or low frequency signal.

In other words, the operator of the amplifier device 10 determines and/or controls the amplifier device 10, in particular the switching unit 26, according to the expected frequency of the incoming signals.

The setting is done as mentioned above by an operating switch 42 and/or the operator panel 44, in particular a graphical user interface on a display of the operator panel 44. The operating switch 42 controls the switching unit 26 or it is part of the switching unit 26.

In general, low, intermediate and high frequency incoming signals can be processed by the amplifier device 10 even though the amplifier device 10 has exactly one input 12 for all these different frequencies.

The correction or distortion and amplification of the incoming signals are performed in similar manner as described for the first embodiment shown in FIG. 1, in particular regarding the adaptive aspects of the pre-correction.

It is ensured that the pre-distortion unit 16 only receives low/intermediate frequency signals due to the first incoming branch line 20 and the down-converter 24 arranged in this first incoming branch line 20.

Figure 3:
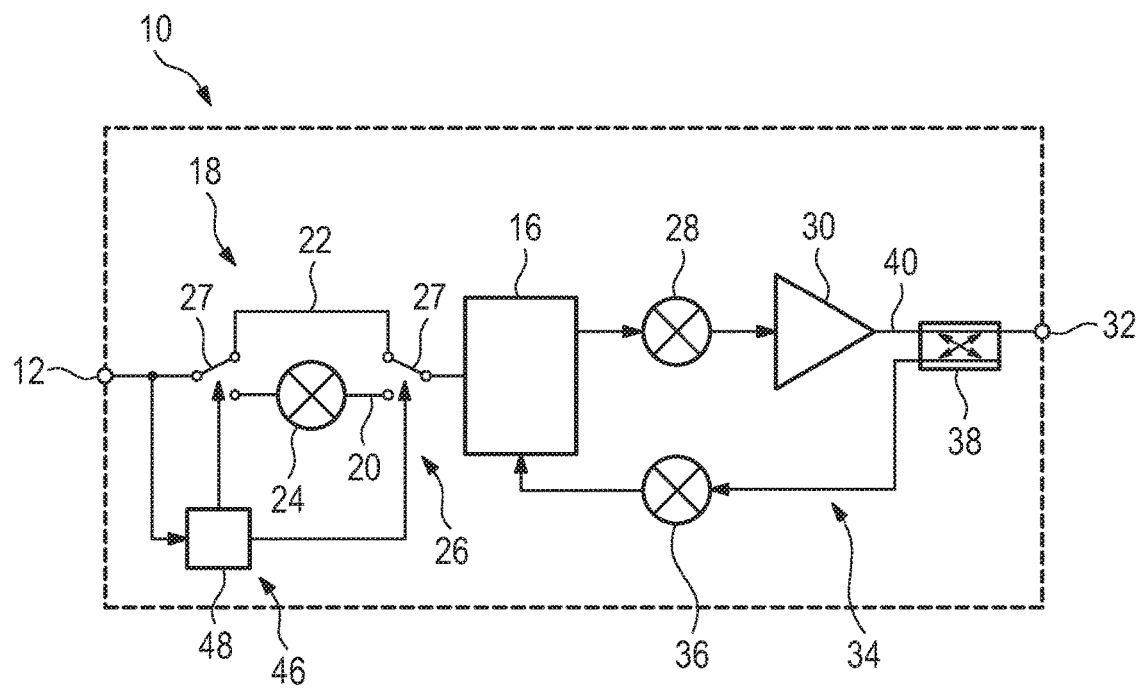
FIG. 3 schematically shows a circuit diagram of an amplifier according to a third embodiment.

In FIG. 3, a third embodiment of the amplifier device 10 is shown which additionally comprises a frequency detection unit 46 which comprises a frequency detector 48.

The frequency detector 48 is connected to the incoming line 18 upstream the first junction which means upstream the first switch 27 of the switching unit 26.

The frequency detection unit 46, in particular the frequency detector 48, detects the frequency of the incoming signal processed via the input 12. Therefore, the frequency detection unit 46 is connected to the incoming line 18, in particular in front of/upstream the switching unit 26.

Depending on the frequency detected by the frequency detection unit 46, the switching unit 26 is set by the frequency detection unit 46 automatically.

For instance, when the frequency detector 48 detects a high frequency incoming signal, the frequency detection unit 46 controls the switching unit 26 such that the incoming signal is processed by the first incoming branch line 20 which comprises the down-converter 24. Then, the high frequency incoming signal is down-converted by the down-converter 24 previously such that the down-converted signal is transmitted to and processed by the pre-distortion unit 16 as already described above.

Should the frequency detector 48 detect an incoming signal that has an intermediate or a low frequency, the frequency detection unit 46 controls the switching unit 26 such that the incoming signal is processed by the second incoming branch line 22 as shown in FIG. 3. Then, the intermediate or low frequency signal is transmitted to the pre-distortion unit 16 without any conversion.

The appropriate signal is corrected in the pre-distortion unit 16, up-converted by the up-converter 28 and then amplified by the amplifier unit 30 as already described with reference to the embodiments shown in FIGS. 1 and 2.

The switching unit 26 is automatically switched correctly once a signal is fed to the input 12. This ensures that the incoming signals are processed by the correct incoming branch line 20, 22.

Figure 4:
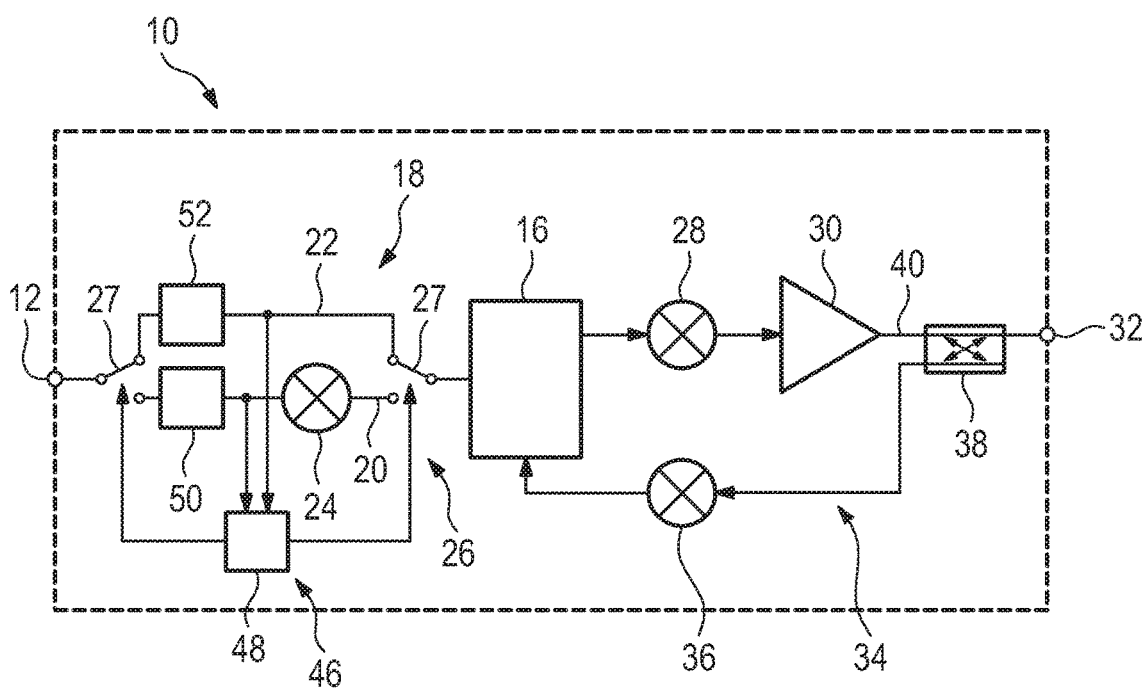
FIG. 4 schematically shows a circuit diagram of an amplifier according to a fourth embodiment.

In FIG. 4, a fourth embodiment of the inventive amplifier device 10 is shown wherein the frequency detection unit 46 additionally comprises two filters 50, 52.

The first filter 50 is arranged in the first incoming branch line 20 whereas the second filter 52 is arranged in the second incoming branch line 22. The filters 50, 52 are used to detect which of the incoming branch lines 20, 22 are currently switched to the input 12 by detecting a signal processed by the dedicated incoming branch line 20, 22.

The filters 50, 52 can be a lowpass filter, a bandpass filter and/or a highpass filter. The type of filter depends on the incoming branch line 20, 22 and the frequency of the incoming signal processed by the dedicated incoming branch line 20, 22.

For instance, the filter 50 in the first incoming branch line 20 processes high frequency incoming signals before they are down-converted by the down-converter 24. Thus, the filter 50 is a highpass or a bandpass filter whereas the filter 52 in the second branch line 22 is a bandpass filter or a lowpass filter as the filter 52 process low or intermediate frequency incoming signals.

In operation, the frequency detection unit 46 detects which of the incoming branch lines 20, 22 are currently processing the incoming signals via the filters 50, 52. Simultaneously, the frequency detection unit 46 detects the frequency of the incoming signal by the frequency detector 48.

When the currently active incoming branch line 20, 22 and the frequency of the incoming signal do not match, then the frequency detection unit 46 controls the switching unit 26, in particular the switches 27, such that the other branch line 20, 22 is connected to the input 12 ensuring that the incoming signal is processed by the corresponding branch line 20, 22.

In this embodiment, the frequency of the incoming signal is detected in the incoming branch line 20, 22.

The operating switch and the operator panel are not shown in the third and fourth embodiment. However, the operating switch and/or the operator panel can also be provided in this embodiment.

For instance, information regarding the currently used and actively switched incoming branch line 20, 22 can be provided to the operator by the operating panel. Particularly, this information can be displayed on a display, preferably in a graphical user interface on the display. Thus, the operator gets the information about which branch line 20, 22 currently processes the incoming signals.

Alternatively or supplementary, the frequency of the incoming signal is displayed so that the operator gets the information and can control the switching unit 26 manually.

In some embodiments, the display is a touch-sensitive display ensuring a direct interaction of the operator with the amplifier device 10.

Regarding the third and fourth embodiment, an automatic detection of the frequency of the incoming signal as well as an automatic control of the switching unit 26 is provided. The operator does not have to control the amplifier device 10, in particular the switching unit 26, regarding the setting of the expected frequency of the incoming signals. Therefore, the risk of failure is minimized.

In general, the amplifier device 10 according to one or more aspects of the present invention is usable for an unlimited incoming frequency range as high frequency incoming signals are down-converted previously via the down-converter 24 arranged in the first incoming branch line 20, in particular in front of/upstream the pre-distortion unit 16. Low or intermediate frequency signals can also be processed by the amplifier device 10 according to one or more aspects of the present invention as the second incoming branch line 22 processes these signals.

Thus, it is ensured that only low/intermediate signals are transmitted to the pre-distortion unit 16 so that an analog pre-distortion unit can be used.

Further, it is possible to down-convert the incoming signal to the baseband in order to correct the signal by digital pre-distortion.

While illustrative embodiments have been illustrated and described, it will be appreciated that various changes can be made therein without departing from the spirit and scope of the claimed subject matter.

The embodiments of the invention in which an exclusive property or privilege is claimed are defined as follows:

1. An amplifier device for high frequency signals, comprising:
    at least one input;
    an incoming line;
    a pre-distortion unit;
    an amplifier;
    a transmission line;
    a feedback unit; and
    an output connected to said amplifier via said transmission line,
    wherein said at least one input being connected to said pre-distortion unit such that two incoming branch lines are provided which are interconnected by a switching unit, said switching unit comprising first and second switches that are arranged in front of both incoming branch lines and after both incoming branch lines, respectively, a first incoming branch line of said two incoming branch lines comprising a down-converter being arranged between said at least one input and said pre-distortion unit, both incoming branch lines being connected in parallel with each other and configured to process the incoming signals fed to the at least one input, wherein the switching unit and the two incoming branch lines ensure that the amplifier device is able to process different frequency ranges.

2. The amplifier device according to claim 1, wherein said feedback unit is connected to said pre-distortion unit and said feedback unit is coupled to said transmission line via a coupler.

3. The amplifier device according to claim 1, wherein said feedback unit comprises a down-converter which down converts the signal received by said coupler.

4. The amplifier device according to claim 1, wherein an up-converter is provided that is arranged between said pre-distortion unit and said amplifier.

5. The amplifier device according to claim 1, wherein said switching unit comprises at least one switch.

6. The amplifier device according to claim 5, wherein said switch is a high frequency switch.

7. The amplifier device according to claim 1, further comprising a high frequency input and a low or intermediate frequency input, said high frequency input and said low or intermediate frequency input being connected to said first branch line and said second branch line, respectively.

8. The amplifier device according to claim 1, wherein said amplifier device comprises exactly one input that is connected to said switching unit via said incoming line.

9. The amplifier device according to claim 1, wherein a frequency detection unit is provided that comprises at least one frequency detector which detects the frequency of a signal transmitted via said incoming line.

10. The amplifier device according to claim 9, wherein said frequency detection unit is connected to said switching unit.

11. The amplifier device according to claim 10, wherein said frequency detection unit is connected to said switching unit such that said frequency detection unit sets said switching unit depending on the detected frequency.

12. The amplifier device according to claim 11, wherein said frequency detector is connected to at least one of said incoming branch lines.

13. The amplifier device according to claim 12, wherein said frequency detector is connected to both branch lines.

14. The amplifier device according to claim 10, wherein said frequency detection unit comprises at least one filter arranged in one of said incoming branch lines.

15. The amplifier device according to claim 14, wherein two filters are arranged in both incoming branch lines.

16. The amplifier device according to claim 1, wherein said amplifier device is configured such that the incoming frequency range is unlimited.

17. The amplifier device according to claim 1, wherein said amplifier device is configured such that any proportion of incoming to output signal is useable.

18. The amplifier device according to claim 1, further comprising an operating switch that is operable by an operator of said amplifier device, said operating switch being configured such that said switching unit can be switched by the operator when the operator actuates said operating switch.

19. The amplifier device according to claim 1, wherein an operator panel is provided, wherein the operator can control said switching unit via said operator panel and/or information regarding the incoming frequency is shown on said operator panel.

20. The amplifier device according to claim 19, wherein a graphical user interface is displayed on a display of said operator panel.

21. The amplifier device according to claim 1, wherein both incoming branch lines are directed to the at least one input such that the incoming signals are processed by both incoming branch lines depending on the switching position of the switching unit.

22. An amplifier device for high frequency signals, comprising:
- at least one input;
- an incoming line;
- a pre-distortion unit;
- an amplifier unit;
- a transmission line;
- a feedback unit; and
- an output;
- wherein said output is connected to said amplifier unit via said transmission line, said at least one input being connected to said pre-distortion unit such that two incoming branch lines are provided which are interconnected by a switching unit, a first incoming branch line of said incoming branch lines comprising a down-converter being arranged between said at least one input and said pre-distortion unit, said amplifier device comprising a high frequency input and a low or intermediate frequency input, said high frequency input and said low or intermediate frequency input being connected to said first branch line and said second branch line, respectively.

23. An amplifier device for high frequency signals, comprising:
- at least one input;
- an incoming line;
- a pre-distortion unit;
- an amplifier unit;
- a transmission line;
- a feedback unit; and
- an output;
- wherein said output is connected to said amplifier unit via said transmission line, said at least one input being connected to said pre-distortion unit such that two incoming branch lines are provided which are interconnected by a switching unit, a first incoming branch line of said incoming branch lines comprising a down-converter being arranged between said at least one input and said pre-distortion unit, a frequency detection unit being provided that comprises at least one frequency detector which detects the frequency of a signal transmitted via said incoming line, said frequency detection unit being connected to said switching unit.

* * * * *